United States Patent [19]

Shaulov et al.

[11] Patent Number: 5,004,726
[45] Date of Patent: Apr. 2, 1991

[54] APPARATUS AND METHODOLOGY FOR THE NON-CONTACT TESTING OF MATERIALS FOR SUPERCONDUCTIVITY BY DETECTING ODD HARMONICS ABOVE A THRESHOLD

[75] Inventors: Avner A. Shaulov, Monsey; Samuel P. Herko, Ossining; Donald R. Dorman, Tarrytown; Rameshwar N. Bhargava, Ossining, all of N.Y.

[73] Assignee: North American Philips Corp., New York, N.Y.

[21] Appl. No.: 380,162

[22] Filed: Jul. 14, 1989

[51] Int. Cl.$^5$ .................. G01R 33/12; G01N 27/72; H01L 39/00
[52] U.S. Cl. .......................... 505/1; 324/201; 324/239; 505/726; 505/727; 505/843
[58] Field of Search .......................... 324/201-203, 324/228, 233, 239, 248; 505/726, 727, 843

[56] References Cited

U.S. PATENT DOCUMENTS 4,851,762  7/1989  Kim et al. .................. 324/233 X

FOREIGN PATENT DOCUMENTS 0194350  8/1986  Japan .................. 324/239
0067484  3/1987  Japan .................. 324/239
0777567  11/1980  U.S.S.R. .................. 324/239
0819684  4/1981  U.S.S.R. .................. 324/239

OTHER PUBLICATIONS

Journal of Applied Physics 52(11), Nov. 1981, pp. 6798-6805, "Superconducting Transition of Multiconnected Josephson Network".

Primary Examiner—Gerard R. Strecker
Attorney, Agent, or Firm—William L. Botjer

[57] ABSTRACT

Apparatus and methodology for the rapid and inexpensive characterization of superconducting materials. The method and apparatus induces an alternating magnetic field in the sample to be tested. If the material is a superconductor odd harmonics are generated in the alternating magnetic response of the material near the transition temperature. The superconducting transitions are manifested by a peak or peaks in the odd harmonic components of the alternating magnetic response as a function of temperature. The peaks of the harmonic components are detected to indicate the presence and number of superconducting transitions.

11 Claims, 5 Drawing Sheets

APPARATUS AND METHODOLOGY FOR THE NON-CONTACT TESTING OF MATERIALS FOR SUPERCONDUCTIVITY BY DETECTING ODD HARMONICS ABOVE A THRESHOLD

BACKGROUND OF THE INVENTION

This invention relates to a device and methodology for characterizing superconductive materials. Specifically, the invention is directed to a device and methodology for determining superconductive transitions without the need for contact with the material and suitable for use with samples that are in the form of powder, thin films, ceramics or single crystals.

The recent discovery of superconductivity at relatively high temperature in Y-Ba-Cu-O materials has started an intensive worldwide search for new superconducting materials. Numerous materials are synthesized daily and tested for superconductivity in many laboratories throughout the world. In order to expedite this effort, a rapid and reliable method is required for eliminating non-promising materials. The most obvious means of determining superconductivity is by an electrical resistance test. However, such a test requires electrical contact with the materials which is difficult, especially if the material is in powdered form.

Commonly, a non-contact magnetic test of flux exclusion or flux expulsion (the Meissner effect) is used to determine if a material is a superconductor. Unlike the electrical resistivity measurement, the magnetic test does not require contact with the materials and can be performed on materials in the powdered state. However with respect to multiphase materials, i.e. materials that exhibit several superconducting transitions, the magnetic testing does not clearly reveal the presence of all the transitions. The present invention provides a inexpensive non-contact device for detecting such superconducting transitions.

SUMMARY OF THE INVENTION

This invention is directed to a non-contact methodology and a simple and inexpensive device for rapid testing of materials for superconductivity. This methodology has the advantages of the existing magnetic techniques, i.e. it does not require contact with the material; it can also be applied to powder and thin film samples as well. Moreover, the present apparatus and methodology can provide information about the presence of the number of superconducting transitions in a given sample. This information can be subsequently used to develop improved materials by altering the preparation and processing of the materials to eliminate unwanted low temperature transitions.

The present methodology and apparatus is based on the effect of harmonic generation in the alternating magnetic response of type II superconducting materials. It has been found that superconducting materials generate third harmonics in response to an alternating magnetic field, See, e.g. *Superconducting Transition of Multiconnected Josephson Network*, Journal of Applied Physics 52,6798(1981). The present invention utilizes the effect to determine the superconductive transitions.

In the present device a relatively small sinusoidal field is produced by a primary coil in magnetic coaction with a pair of balance coils, one of which contains the sample to be tested. The off balance voltage induced in the coil pair is monitored as a function of temperature. If for example, the sample is at a temperature below its superconducting transition point, as the temperature increases towards the transition point, the lower critical field of the material decreases and at some point it drops below the driving field. At this point, flux lines start to penetrate the material and the magnetization induced by the sinusoidal field traverses hysteresis loops. As a result of this nonlinear magnetic response, a non-sinusoidal voltage is induced across the sample holding coil, and components of the voltage at harmonics of the driving frequency are generated. Hysteresis loops that are symmetrical with respect to the origin cause the generation of odd harmonics. When the flux lines fully penetrate the material, the odd harmonics reach a maximum. These harmonics disappear as the temperature increases beyond the transition point. Thus, the superconducting transition is manifested by a peak in the harmonic components of the alternating magnetic response. Relatively simple and inexpensive equipment may be utilized to indicate the presence of and to count the superconducting transitions indicated by the peaks of the odd harmonic components.

BRIEF DESCRIPTION OF THE DRAWINGS

For better understanding of the invention, reference is made to the following drawings in which.

DESCRIPTION OF THE PREFERRED EMBODIMENTS

Figure 1:
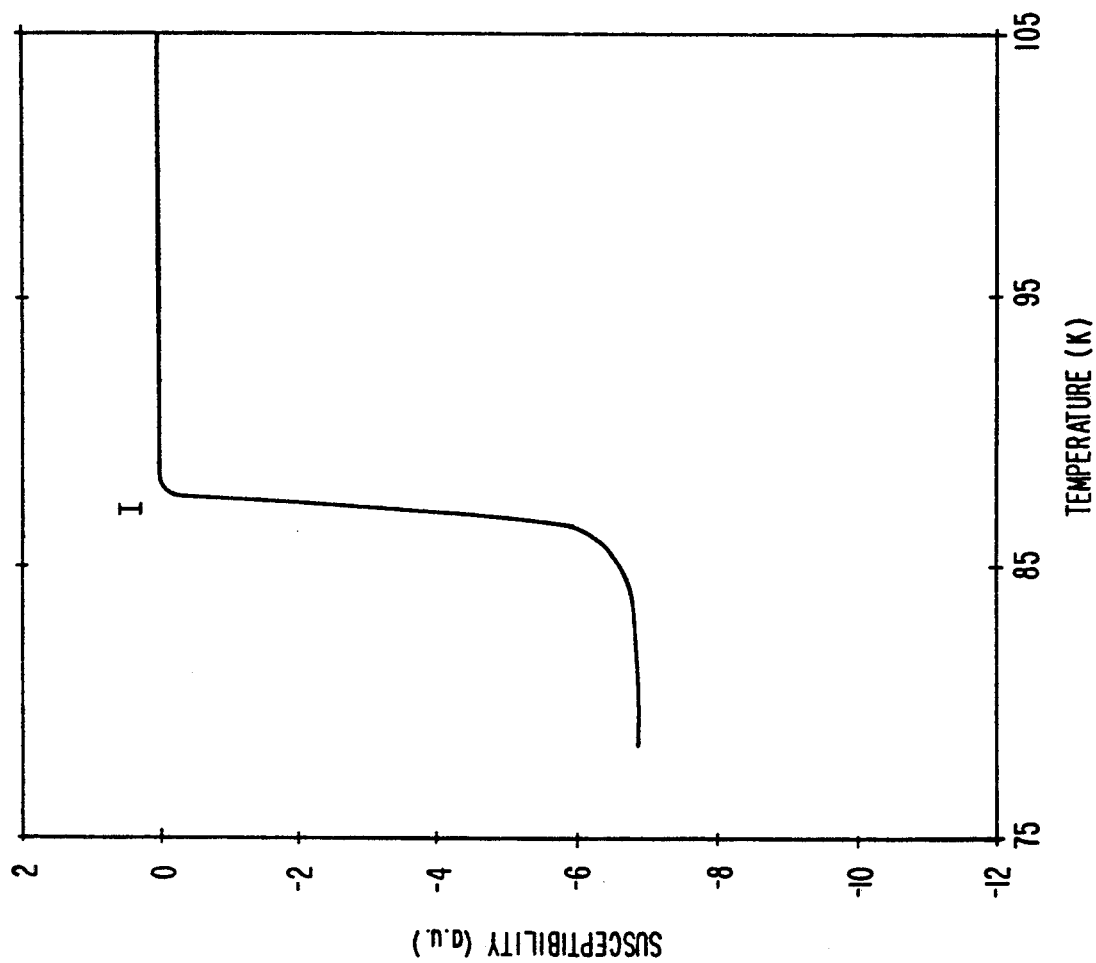
FIG. 1 is a graph of magnetic susceptibility versus temperature for a single phase superconducting material (sintered Y-Ba-Cu-O)
Figure 2:
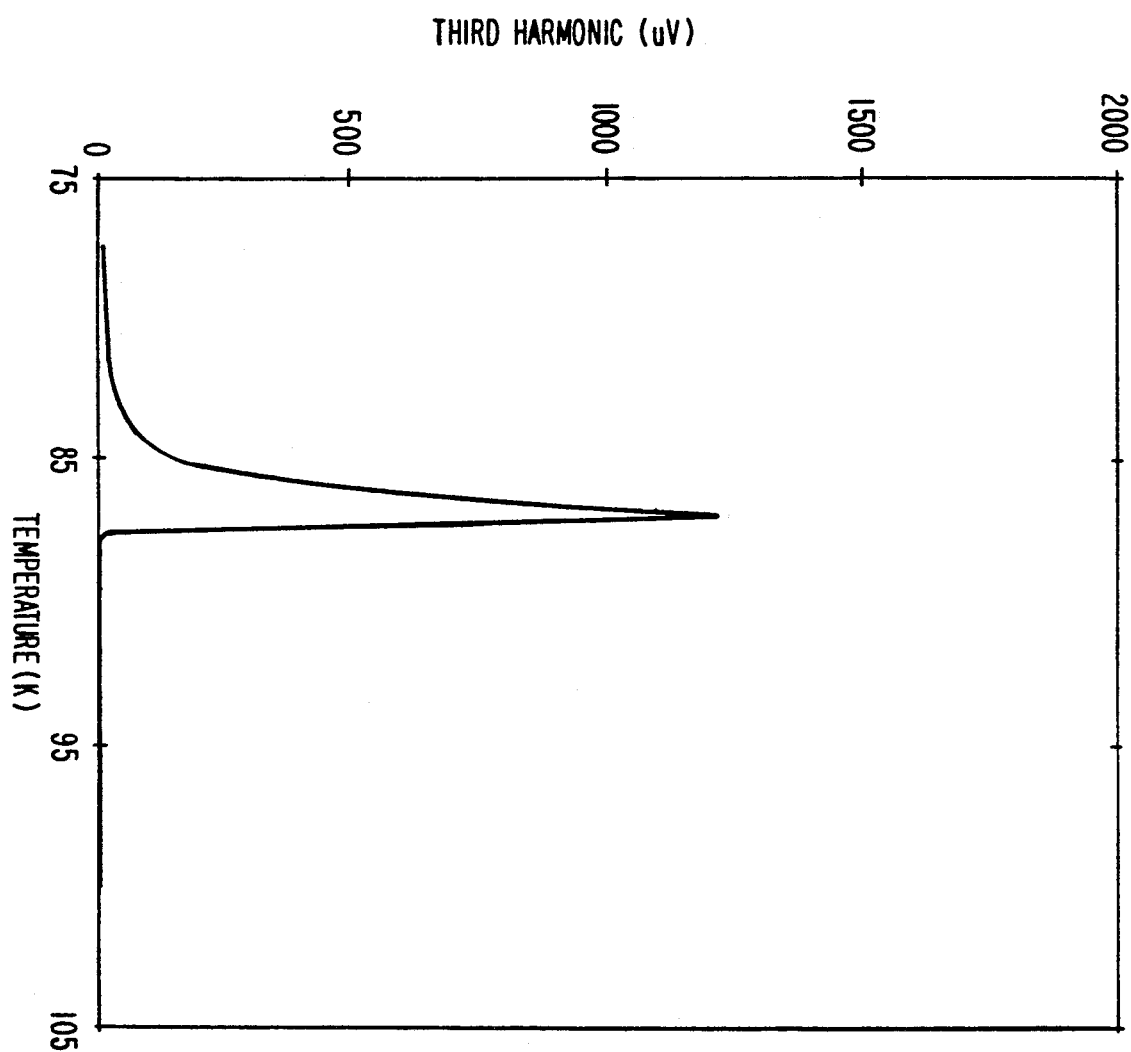
FIG. 2 is a graph of the amplitude of the third harmonic component of an induced alternating voltage as a function of temperature in single phase superconducting material (sintered Y-Ba-Cu-O)

FIG. 1 is a magnetic susceptibility versus temperature graph of a sample of single phase superconductive material (sintered Y-Ba-Cu-O). The temperature of the material in degrees Kelvin is plotted along the X axis and the magnetic susceptibility, in arbitrary units, is plotted on the Y axis. As can be seen in FIG. 1 the magnetic susceptibility of the material is essentially zero up until approximately 88° K. Thereafter, at portion I of the curve of FIG. 1, the magnetic susceptibility abruptly becomes negative, indicating a transition to superconductivity at this temperature (called $T_c$). FIG. 2 illustrates the amplitude of the third harmonic component output of the balanced coils (described below) containing the sample of a single phase superconductive material shown in FIG. 1. It is seen that there is a clear and distinct peak of the third harmonic output which occurs at 88° which corresponds to the transition I noted in FIG. 1. The peak clearly indicates the presence of the superconducting transition.

Figure 3:
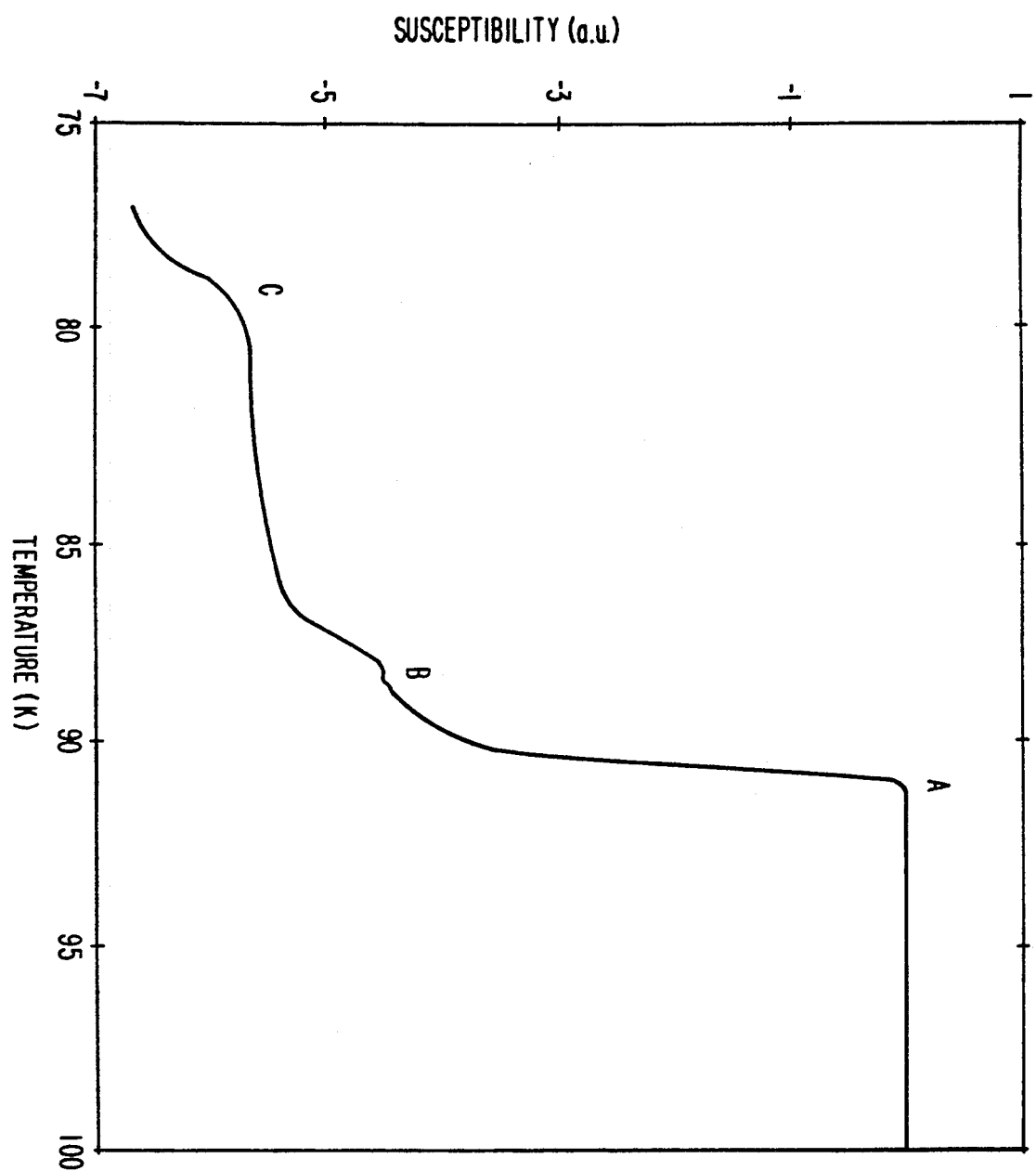
FIG. 3 is a graph of magnetic susceptibility versus temperature for a multiphase superconducting material.

FIG. 3 illustrates a magnetic susceptibility versus a temperature graph of a non-ideal example of superconductive material. The graph is plotted in the same manner as that of FIG. 1. As can be seen this material has a first superconductive transition at point A (90° K.). Further it is noted that the magnetic susceptibility curve at lower temperatures is not smooth, but rather includes a second transition at point B (87° K.) and a third transition at point C (78° K.). The exact phenomenon governing the existence of additional transitions is not well understood and indeed, superconducting materials having more than one transition are generally not considered to be good superconductors.

While the equipment required to generate a magnetic susceptibility graph such as that of FIG. 3 is generally available, the additional transitions are not easily detectable in the graph. The present invention is directed to reliable and inexpensive equipment for detecting such superconducting transitions.

Figure 4:
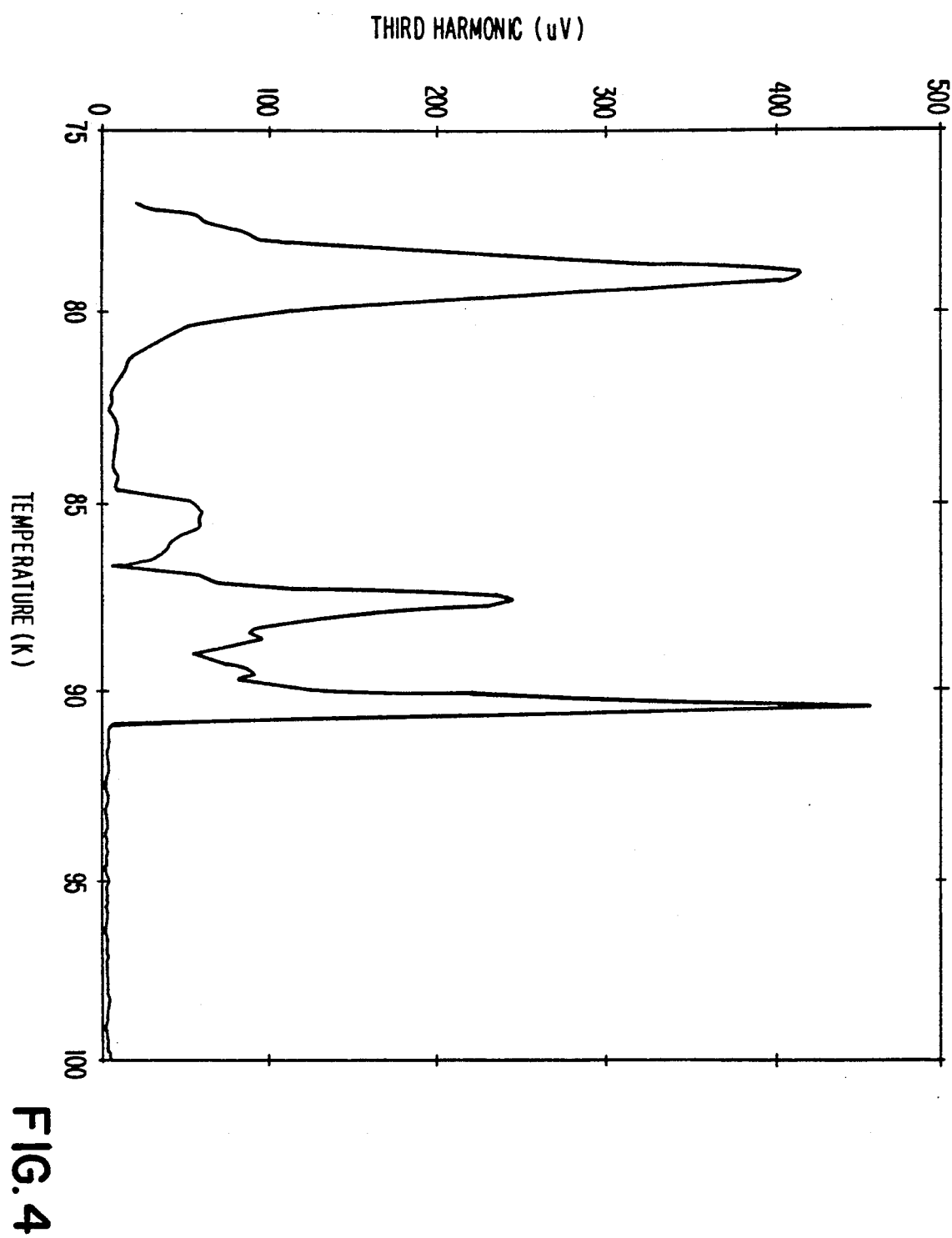
FIG. 4 is a graph of the amplitude of a third harmonic component of an induced alternating voltage as a function of temperature in a multiphase superconducting material.

FIG. 4 illustrates the amplitude of the third harmonic component output of the balanced coils containing the non-ideal sample of superconductive material shown in FIG. 3. It is seen that there are three distinct peaks of the third harmonic output and it is further noted that these peaks occur at 92°, 87° and 78° K. which corresponds to transitions A, B, C noted in FIG. 3. These peaks are clear and distinct and clearly illustrate the superconducting transitions. Since each of the peaks is of a magnitude greater than a predetermined arbitrary threshold voltage, such as 120 microvolts, such peaks, and thus any superconducting transitions, can readily be detected by a peak detector. The present invention is directed to relatively inexpensive circuitry for detecting the third harmonic peaks and thus indicating the presence of superconducting material and the number of transitions present therein.

Figures 5, 6:
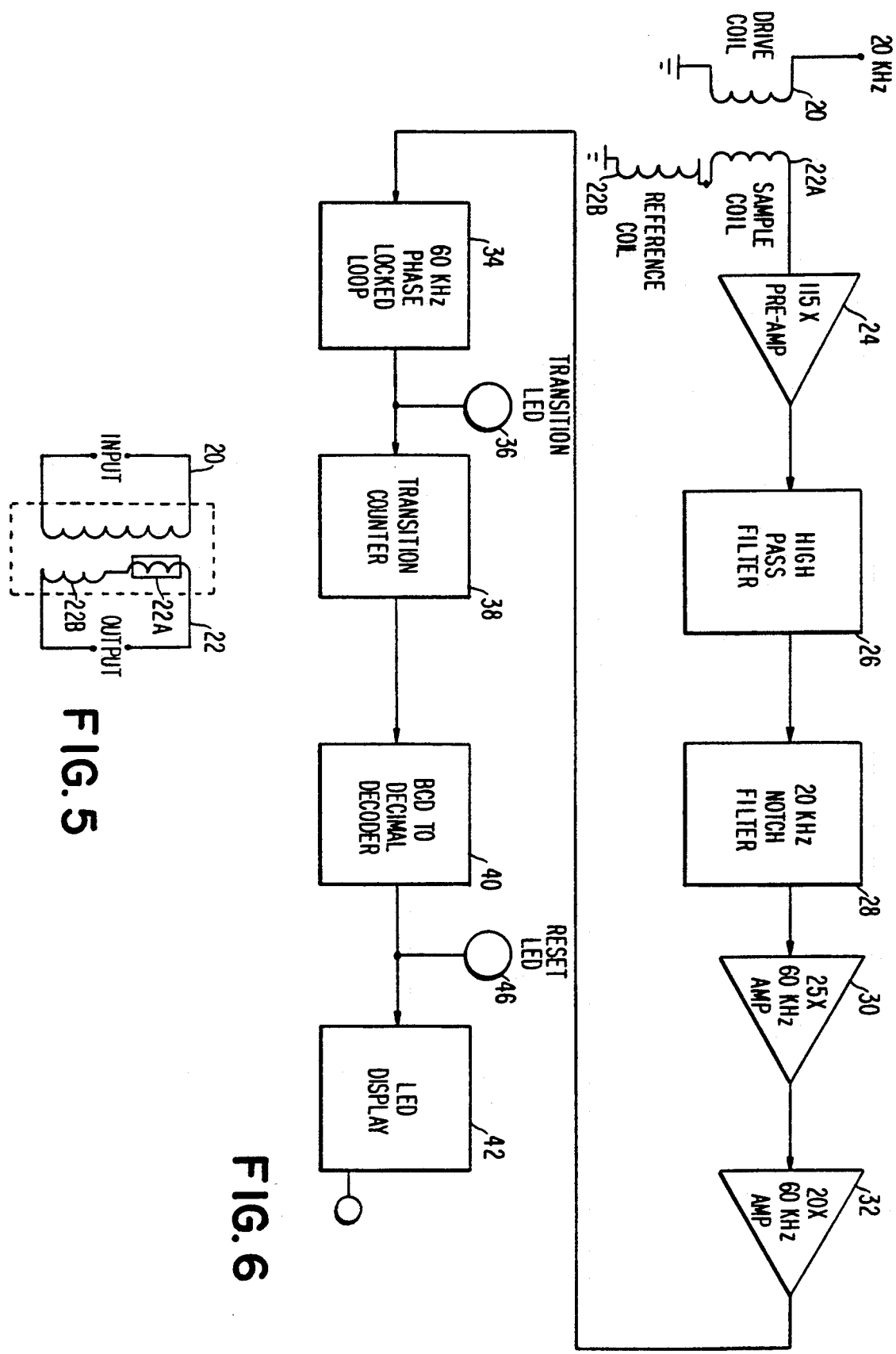
FIG. 5 is a schematic illustration of the input coil and balanced output coils in which the sample to be measured is disposed.
FIG. 6 is a block diagram of exemplary circuitry for determining superconducting transitions of a sample material.

FIG. 5 illustrates the input coil assembly used in the inventive device. The input coil assembly consists of a primary coil 20 surrounding two identical secondary coils 22A, 22B which are wound in series opposition. There is no output voltage from the secondary coils if the environment in the coils and surrounding the coils is the same. A 20 kHz (or other frequency) sine wave is applied to primary coil 20, the sample material to be measured is placed in secondary coil 22A with the other secondary coil 22B acting as a reference coil. When the sample is cooled through the superconducting transition point an imbalance in the sample coil 22A with respect to the reference coil 22B occurs, causing the generation of odd harmonic signals in sample coil 22A.

As shown in FIG. 6 the output of the sample coil 22A is applied to a preamplifier 24 which amplifies the output on the order of 100 times. The output of preamplifier 24 is in turn applied to a high pass filter 26 which attenuates frequencies below 20 kHz thus minimizing low frequency noise. The output of high pass filter 26 is applied to the input of a 20 kHz notch filter 28 which attenuates the 20 kHz fundamental signal and passes the harmonics. The "harmonics only" signal taken from 20 kHz notch filter 28 is applied to ganged amplifiers 30, 32 which amplify the signal on the order of 500 times.

The output of amplifier 32 is applied to a 60 kHz phase locked loop 34 which forms a 60 kHz detector (60 kHz being the first odd harmonic of the 20 kHz driving signal). If the input signal to phase locked loop 34 exceeds, for example, 100 mV, the phase locked loop locks onto the 60 kHz signal. The 60 kHz detector 34 senses the presence of the 60 kHz signal and changes its output from high to ground causing a transition LED 36 to light and a transition counter 38 to advance by one. The output of the transition counter 38 is the binary coded decimal (BCD) value of the number of transitions detected. This BCD value is applied to a BCD to decimal decoder 40 and the decoded decimal value is passed to a ten position LED bar graph display 42. If the input level applied to the phase lock loop 34 falls below 100 mV, the transition LED 36 is extinguished, but bar graph display 42 retains the number of transitions encountered. Activating a transition counter reset push button 44 resets the bar graph display to zero and illuminates the reset LED 46. This returns the device to the neutral position and thus is ready for another sample.

The actual components and operational parameters utilized in the circuitry of FIG. 6 are not critical. At the outset, the coils need not be driven at 20 kHz as a wide range of driving frequencies may be used. The amplifiers 24, 30, 32 may be replaced by any other suitable amplifiers providing the requisite amplification. The 100 mV threshold is also not critical since its level is dependent upon the values of the other electrical components and the level of the driving signal. Other odd numbered harmonics such as the fifth, seventh etc., instead of the third harmonic could also be used, but the third harmonic is usually the strongest and thus most easily detectable. Similarly, the threshold detector 34 need not be a phase locked loop and can be many other types of detector. Finally, the transition counter 38 and the display 42 can be other than that previously described. It is only necessary that the device function to detect that the third harmonic obtained from the sample coil 22A is above a predetermined threshold.

Although the present invention has been described in conjunction with preferred embodiments, it is to be understood that modifications and variations may be resorted to without departing from the spirit and scope of the invention, as those skilled in the art will readily understand. Such modifications and variations are considered to be within the purview and scope of the invention and the appended claims.

What is claimed is:

1. A device for determining if a sample of material is a superconductor, comprising:
   means for inducing an alternating magnetic field in the sample of material to be tested;
   means for measuring the amplitude of the odd numbered harmonic component of the magnetic field induced in the sample to be tested;
   means connected to said measuring means for determining if the amplitude of the odd numbered harmonic has exceeded a predetermined threshold amplitude; and
   means connected to said amplitude determining means for indicating that the threshold amplitude has been exceeded to indicate that a superconducting transition has occurred.

2. The device as claimed in claim 1 further including means for counting the number of times the threshold amplitude has been exceeded as the sample temperature changes.

3. The device as claimed in claim 1 wherein said means for inducing an alternating magnetic field comprise a magnetic coil.

4. The device as claimed in claim 1 wherein said means for measuring the odd numbered harmonic component of the magnetic field comprise a balanced coil, one side of said balanced coil holding the sample to be measured, the other side of said balanced coil being a reference coil.

5. The device as claimed in claim 1 wherein the odd numbered harmonic component is the third harmonic.

6. The device as claimed in claim 1 wherein the alternating magnetic field has a frequency of about 20 kHz.

7. A method for determining if a sample of material is a superconductor comprising the steps of:

varying the temperature of the sample of material through its critical temperature ($T_C$);

applying an alternating magnetic field to the sample to be tested;

measuring the odd numbered harmonic component of the magnetic field induced in the sample to be tested;

comparing the amplitude of the odd numbered harmonic component with a predetermined amplitude to determine if the predetermined amplitude has been exceeded; and indicating that the threshold amplitude has been exceeded to thereby indicate that a superconducting transition has occurred.

8. The method as claimed in claim 7 further including the step of counting the number of times the predetermined amplitude has been exceeded as the temperature of the sample increases.

9. The method as claimed in claim 7 wherein the step of applying the alternating magnetic field to the sample to be tested comprises disposing said sample in a magnetic coil.

10. The method as claimed in claim 7 wherein the harmonic component measured is the third harmonic.

11. The method as claimed in claim 7 wherein the alternating magnetic field is on the order of 20 kHz.

* * * * *